Figure 1:
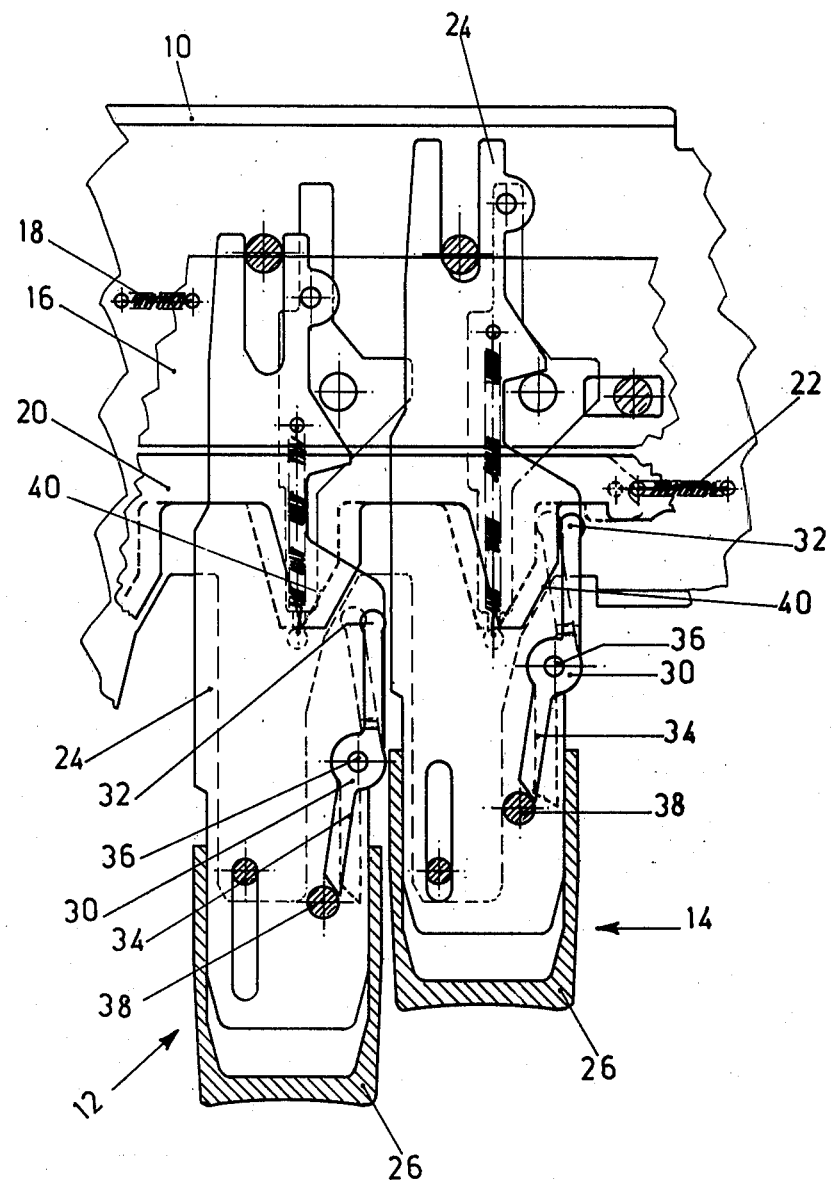

United States Patent [19]

Dellantonio

[11] 4,299,132

[45] Nov. 10, 1981

[54] DEVICE FOR DISABLING THE CONTROL OF DISENGAGEMENT FOR THE TUNING KNOB, PARTICULARLY FOR A KEYBOARD CAR RADIO

[75] Inventor: Ezio F. Dellantonio, Rome, Italy
[73] Assignee: Autovox S.p.A., Rome, Italy
[21] Appl. No.: 133,088
[22] Filed: Mar. 24, 1980
[30] Foreign Application Priority Data Mar. 30, 1979 [IT] Italy .................................. 48563 A/79

[51] Int. Cl.³ .............................................. H03J 5/12
[52] U.S. Cl. ................................ 74/10.33; 192/93 R; 334/7
[58] Field of Search ............... 74/10.33, 10.37; 334/7; 142/93 R

[56] References Cited

U.S. PATENT DOCUMENTS 4,191,058 3/1980 Stamm ................................. 74/10.33
4,232,560 11/1980 Dellantonio ....................... 74/10.33

Primary Examiner—Allan D. Herrmann
Attorney, Agent, or Firm—Ladas & Parry

[57] ABSTRACT

A device for disabling the engagement control of the tuning knob, particularly for a keyboard car radio, allows to disable the tuning knob as soon as one of the keys is preset to a corresponding desired station. The device comprises a rocking member (30) having two arms (32) and (34), which has its fulcrum on slide frame (24) of key (12) and a pin (38) integral with key cap (26) of key (12), which key cap (26) is movable on slide frame (24) between an inserted position and an extracted position. The arrangement is such that, in the inserted position of cap (26) with respect to frame (24) of the key, pin (38) locks arm (34) of rocking member (30), which through its other arm (32) moves a slider (20) which controls disengagement of the clutch, thus relieving the control from the tuning knob when key (12) is in its operative position.

2 Claims, 2 Drawing Figures

DEVICE FOR DISABLING THE CONTROL OF DISENGAGEMENT FOR THE TUNING KNOB, PARTICULARLY FOR A KEYBOARD CAR RADIO

This invention relates to a device for disabling the control of disengagement for the tuning knob, particularly for a keyboard car radio.

In keyboard car radios, in which a number of keys may be operated in order to tune, when in their operative position, an equal number of stations preset on the keys, it is necessary to provide a disengagement control for the tuning knob in order to inhibit the use of such knob when a key is in its operative position in order to avoid wear and tear of parts, which would be caused in the attempt of manually changing the tuning frequency through the knob when a key is in its operative position and therefore tends to keep the mechanism on the preset tuning frequency.

A device of this type is described in the copending patent application Ser. No. 849,739 of Nov. 9, 1977, now U.S. Pat. No. 4,232,560, assigned to the same assignee, and comprises a clutch disengagement control slider which is moved to free the knob control clutch when a key is pressed into its innermost, operative position. In the case in which it is desired to preset the key to a selected station, tuned in through the knob control, it is necessary to extract the cap of the key, tune in the radio on the station by means of the knob and push the key fully in, thus driving the key cap back in, as the key reaches its operative position at the end of its stroke.

When the key cap is out, a slider engaging tongue, which is present on the key, is displaced with respect to the plane of the slider and therefore does not cause the disengagement of the clutch during the operation of presetting the key.

However, such device has the great disadvantage that, once the key has been preset, the key itself stays in its operative position and the clutch remains in engagement.

This drawback is not so serious if the knob control acts through friction elements capable of sliding.

In this case a great amount of wear takes place, but the user generally desists from the use of the knob immediately, if no corresponding variation in tuning is obtained.

In the case of positive transmission of motion from the knob to the tuning runner, th disadvantage is far more serious. This case, in fact, can eventually lead to breakdown of the transmission itself.

It is the main object of this invention to eliminate the disadvantage described heretofore by means of a reliable, small-sized device of low industrial cost.

According to this invention a device for disabling the control of disengagement for the tuning knob, particularly for a keyboard car radio in which a plurality of keys may be brought into their operative position in order to tune in the radio on corresponding stations, a key positioning link keeps each key in its operative position, a clutch disengagement control slider, when moved, disables control from the tuning knob and each key has a slide frame and a key cap movable on the slide frame between an inserted and an extracted position, comprises: a rocking member with two arms, fulcrumed on the slide frame of the key; and a pin integral with the key cap, the arrangement being such that, in the inserted position of the key cap, with respect to the key, the pin locks a first arm of said rocking member, which, through its second arm, moves the clutch disengagement control slider when the key is in its operative position.

With the device of this invention, therefore, the considerable advantage is obtained that the knob control is disabled as soon as the presetting of the key operation ended.

Figure 2:
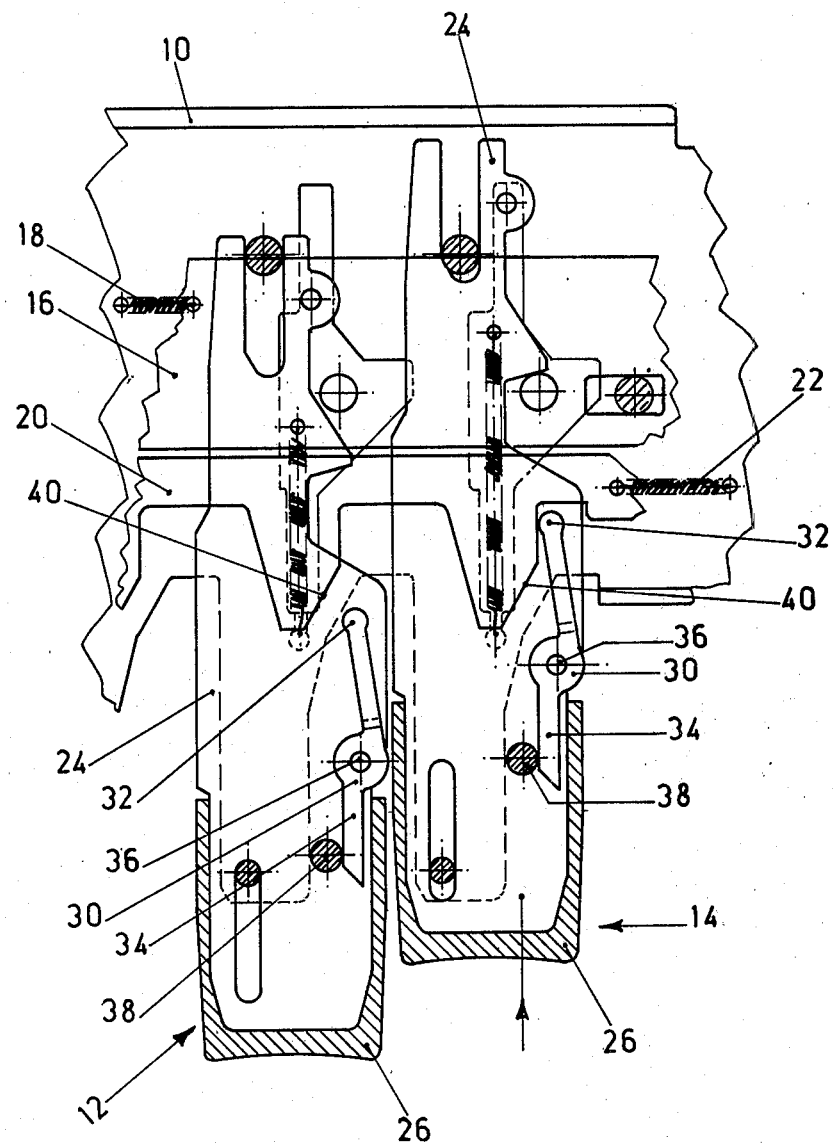

A device according to the present invention will now be described by way of example, and not in a limiting sense, with reference to the accompanying drawings, in which:

FIG. 1 is a partial plan view of a keyboard with a key in its position at the beginning of the presetting operation; and FIG. 2 is a view similar to FIG. 1, with the key in its position at the end of the presetting operation.

As shown in the drawings, the car radio is provided with a frame 10, with respect to which a plurality of keys may reciprocate. Only two keys are shown for sake of clarity, and are identified by 12 and 14.

Key 12 is in its extracted or inoperative position and key 14 is in its inserted or operative position with respect to frame 10.

Key 14 is held in its operative position by a key positioning link 16 biased by spring 18. A clutch disengagement control slider 20, when moved against the action of a spring 22, disengages the tuning knob control.

Each key comprises a slide frame 24 and a key cap 26. Key cap 26 may reciprocate on frame 24 between an extracted position shown in FIG. 1 and an inserted position shown in FIG. 2.

As for operation of such a keyboard reference should be made to the cited copending patent application Ser. No. 849,739 to the specification of which reference should be made for a more thorough understanding of the apparatus.

The device according to this invention comprises a rocking member 30 with two arms 32 and 34. The rocking member has its fulcrum on key frame 24 around a pivot 36. A pin 38 is integral with key cap 26 and, in the position of key cap 26 inserted with respect to the frame 24 of the key, pin 38 engages arm 34 of the rocking member 30, forcing it into the position shown in FIG. 2. In such a position arm 32 of rocking member 30 cooperates with a slanted trapezoidal profile 40 of slider 20 to disengage the tuning knob control.

Operation of the device according to this invention is as follows:

Having to memorize any whatsoever position of the tuning runner, and therefore any whatsoever station, it will be necessary to insert the knob control and tune in the radio on the station.

All keys will be in the extracted position as shown for key 12 in FIG. 2.

In order to memorize the station it is necessary to extract the key cap of a key, which will now be in the condition key 12 in FIG. 1 is in. Pin 38 is now disengaged from rocking member 30, which rotates on pivot 36 when the key is pushed into its innermost position as shown for key 14 in FIG. 1.

During the movement of the key, arm 32 of rocking member 30 slides over profile 40 of slider 20 without moving it.

Once the key has reached its innermost position, in order to memorize the station, it is necessary to push key cap 26 towards its inserted position, in which position the key cap 26 blocks the usual station memory element.

During the movement of key cap 26 between its extracted position and its inserted position with respect to frame 24 of the key, pin 38 causes rotation of rocking member 30, which, through its arm 32, moves slider 20, disabling the control from the tuning knob, which is now inoperative. In the final position shown by key 14 in FIG. 2, the station is thus memorized and the tuning knob is relieved of station searching control.

In the event that an already preset key is pressed into its operative position, arm 32 of rocking member 30 will not be free to rotate sliding along profile 40 of slider 20, the key cap now being inserted.

In such a case, the key will immediately disable the control from the tuning knob.

It is obvious that various and different changes may be applied by those skilled in the art to the embodiment of the invention heretofore described without departing from the spirit thereof; it is intended that all such changes fall within the scope of the invention.

What is claimed is:

1. A device for disabling the control of disengagement for the tuning knob, particularly for a keyboard car radio in which a plurality of keys may be brought into their operative position in order to tune in the radio on corresponding stations, a key positioning link keeps each key in its operative position, a clutch disengagement control slider, when moved, disables control from the tuning knob and each key has a slide frame and a key cap movable on the slide frame between an inserted position and an extracted position, comprising:

a rocking member with two arms, fulcrumed on the slide frame of the key;

and a pin integral with the key cap, the arrangement being such that, in the inserted position of the key cap, with respect to the key, the pin locks a first arm of said rocking member, which, through its second arm, moves the clutch disengagement control slider when the key is in its operative position.

2. A device according to claim 1, wherein said clutch disengagement control slider is provided with projections having a slanted trapezoidal profile cooperating with said second rocking member arm.

* * * * *